(12) United States Patent
Pickering

(10) Patent No.: US 9,536,597 B2
(45) Date of Patent: Jan. 3, 2017

(54) LOW-POWER SRAM CELLS

(71) Applicant: SURECORE LIMITED, Leeds (GB)

(72) Inventor: Andrew Pickering, Rugby (GB)

(73) Assignee: Surecore Limited, Leeds (GB)

(*) Notice: Subject to any disclaimer, the term of this patent is extended or adjusted under 35 U.S.C. 154(b) by 0 days.

(21) Appl. No.: 14/646,965

(22) PCT Filed: Nov. 15, 2013

(86) PCT No.: PCT/GB2013/053020
§ 371 (c)(1),
(2) Date: May 22, 2015

(87) PCT Pub. No.: WO2014/080184
PCT Pub. Date: May 30, 2014

(65) Prior Publication Data
US 2015/0294714 A1    Oct. 15, 2015

Related U.S. Application Data

(60) Provisional application No. 61/732,624, filed on Dec. 3, 2012.

(30) Foreign Application Priority Data

Nov. 26, 2012  (GB) ................................ 1221230.4

(51) Int. Cl.
*G11C 11/00*    (2006.01)
*G11C 11/419*   (2006.01)
*G11C 11/412*   (2006.01)

(52) U.S. Cl.
CPC ............ *G11C 11/419* (2013.01); *G11C 11/412* (2013.01)

(58) Field of Classification Search
CPC ............................ G11C 11/419; G11C 11/412
See application file for complete search history.

(56) References Cited

U.S. PATENT DOCUMENTS 5,255,230 A   10/1993   Chan et al.
6,049,492 A    4/2000   Vogelsang et al.
(Continued)

FOREIGN PATENT DOCUMENTS

JP     2002093176    3/2002

OTHER PUBLICATIONS

International Preliminary Report on Patentability in International Application No. PCT/GB2013/053020, issued May 26, 2015.
(Continued)

*Primary Examiner* — Richard Elms
*Assistant Examiner* — Mohammed A Bashar
(74) *Attorney, Agent, or Firm* — Meunier Carlin & Curfman LLC

(57) ABSTRACT

The present invention provides a memory unit (4) comprising: a storage element (6) comprising a pair of back to back inverters (12a, 12b and 14a, 14b) having respective first and second storage access nodes (24, 26); first and second voltage lines (VSS, VDD 16a, 6b) across which said pair of back to back inverters (12a, 12b and 14a, 14b) are connected; a first access transistor (18a), connected to said first storage node (24); a second access transistor (18b), connected to said second storage node (26); a write word line (22) connected to a gate (18g1) on said first access transistor (18a) and a gate (18g2) on said second access transistor (18b); a first bit line (28) operably connected for controlling said node (24); a second bit line (30) operably connected for controlling said node (26); in which there is provided a data dependent conductive path (46) between the first and second bit lines (28, 30).

15 Claims, 9 Drawing Sheets

(56) References Cited

U.S. PATENT DOCUMENTS

| | | | |
|---|---|---|---|
| 6,091,626 A * | 7/2000 | Madan | G11C 11/412 |
| | | | 365/154 |
| 6,275,431 B1 | 8/2001 | Kojima et al. | |
| 7,808,812 B2 | 10/2010 | Liu et al. | |
| 2005/0265095 A1 | 12/2005 | Sumitani et al. | |
| 2007/0139996 A1 | 6/2007 | Ozawa | |
| 2010/0124099 A1 | 5/2010 | Wu et al. | |
| 2011/0157954 A1 | 6/2011 | Rimondi et al. | |

OTHER PUBLICATIONS

Kong Zhi Hui, et al., "A 16Kb 10T-SRAM with 4x read-power reduction," IEEE International Symposium of Circuits and Systems, 2010, pp. 3485-3488.

Sherif A. Tawfik, et al., "Stability Enhancement Techniques for Nanoscale SRAM Circuits: A Comparison," 2008 International SoC Design Conference, pp. 113-116.

Great Britain Intellectual Property Office Examination Report for Great Britain Patent Application No. GB1221230.4, dated Oct. 10, 2014.

Great Britain Intellectual Property Office Search Report for Great Britain Patent Application No. GB1221230.4, dated Dec. 20, 2012.

International Search Report and Written Opinion, mailed Feb. 28, 2014, in International Application No. PCT/GB2013/053020.

\* cited by examiner

LOW-POWER SRAM CELLS

CROSS REFERENCE TO RELATED APPLICATIONS

This application claims the benefit of U.S. Provisional Application No. 61/732,624, filed Dec. 3, 2012, and Great Britain Patent Application No. 1221230.4, filed Nov. 26, 2012, both of which are incorporated herein by reference in their entireties.

The present invention relates to SRAM cells and relates particularly to such cells with a reduced power requirement.

Data storage is an essential requirement for virtually all modern digital electronic systems. Static read/write memory (SRAM) comprises a major part of that function, being relatively easy to integrate thus offering fast access and low power. With the advent of deep sub-micron (DSM) geometry silicon processing, the task of implementing reliable SRAM storage whilst simultaneously maintaining low power consumption becomes increasingly problematic, whilst conversely demand rises with the proliferation of battery-powered electronic gadgets requiring progressively larger memories.

The present invention provides new designs of memory cells which address both reliability and power aspects of performance. The proposals intrinsically draw no current during a read operation. They may also implement a selectable data-dependent path between bit lines during a read step and also utilise the state of the bit lines to determine whether a cell is being accessed for read (8t and 10t versions) or write (10t versions only). Further, the proposals may also eliminate loading of storage elements during read operations (8t and 10t variants) and may also eliminate loading of storage elements during write operations (10t variants only).

The most commonly-used design of memory cell is the 6-transistor circuit shown in FIG. 1 and consists of a storage element made up of two back-to-back inverters [MN1, MP1] and [MN2, MP2] with additional access transistors (MA1 and MA2) which are turned ON by means of a word line control WL to form a conducting path between the cell data storage nodes (N1 and N2) and the external bit lines (BLA and BLB). Writing to the cell is achieved by forcing a high voltage onto one of BLA or BLB whilst simultaneously forcing a low voltage onto the other, and then driving the word line WL high to activate the access path allowing the voltage levels held on the bit lines (BLA and BLB) to overcome the state of the storage element. The word line is then driven low to disconnect the memory cell with its data store held in its new state. Reading from the cell is achieved by initially driving BOTH bit lines to a notionally high voltage level before then driving the word line WL high. One of either BLA or BLB will then be pulled low through the access devices by the low voltage side of the storage cell. The difference in voltage levels between the two bit lines can then be sensed and used to determine the data value.

One crucial part of the design of this cell is the drive strength ratios of the NMOS pull down transistors (MN1 and MN2), the NMOS access devices (MA1 and MA2) and the PMOS pull up devices (MP1 and MP2): the access devices need to be sufficiently large relative to the pull-ups to guarantee the cell state is over-written during a write, but not so large (relative to the pull-downs) that the cell becomes over-loaded and unstable during a read thereby causing the stored data value to be lost.

The act of reading this cell therefore presents its most challenging operating condition for retaining its data whilst the storage elements are loaded via the access devices (i.e. access devices turned on and both bit lines high). With the inevitable degree of random device variability suffered on DSM technologies due to the very small geometry of the individual devices, simultaneously meeting both writability and read stability criteria on all cells in a very large memory (10's of millions of bits) becomes extremely challenging.

In order to alleviate the difficulty of addressing these conflicting requirements simultaneously, an increasingly common practice is to use an 8-transistor cell design such as that shown in FIG. 2. This effectively separates out the write and read paths of the circuit, by the addition of two extra NMOS devices: one whose gate is driven by one of the storage nodes (MDR) and one which acts as an access device (MAR) to a separate bit line (RBL) used solely for read operations. Write operations on this 8-t cell design are identical to those for the 6-t cell. For reads, however, instead of the write word line WWL being driven high, the single read bit line is initially pre-charged to a high voltage and then the read word line RWL driven high. That enables the data-dependent discharge path from the read bit line through the cell to VSS, and so the read bit line RBL will either stay high (due to its capacitance) or be pulled low by the cell. The state of the read bit line can then be sensed to determine the data value stored in the selected bit.

A block of memory constructed from traditional 6-transistor memory cells is shown in FIG. 3. This contains an array of M rows by N columns of cells, with the word lines connected horizontally across the array and bit lines running vertically. At the bottom of the array there is a multiplex structure selecting which of the columns is to be accessed (for either read or write) according to a set of column select signals (sel_1, sel_2 etc.) which are derived from the address supplied to the memory by the user. Such a block would be replicated for each bit of the memory input/output data word. Thus N columns are required to store the data for each single bit. The value of the column mux selection ratio N is generally dictated by architectural and layout constraints; values of 4, 8 or 16 often being favoured. Initially before each memory access, the bit lines for all columns are precharged into a high state (circuitry not shown).

For a write operation, the voltage on one or other of the bit lines (according to the required input data value) is driven low just for the required column and then the word line pulsed high for long enough to write the data into that cell. Similarly for a read operation, the word line on the required row is driven high, and this causes all the cells on that row to try to assert their data value onto the bit lines. One of the columns will be enabled by the column select signals to drive its bit line voltages out to the sense amp which detects the voltage difference on the bit lines to determine the memory cell's state.

Although any read or write operation will target only one of the N columns in the memory block at any time, the access devices in the memory cells will be enabled for every column in the active row. This results in N−1 cells all unnecessarily trying to assert their data onto their respective bit lines during those operations. This both represents wasted power and also presents those cells with their data retention challenge state (access devices turned on, bit lines high), rendering the entire row vulnerable to external noise.

Whilst the addition of the read buffering transistors in the standard 8-t cell allows more flexibility in optimising performance (e.g. the read devices can be made larger to attain faster reading speed without rendering the cell unwritable), it does nothing to address power wastage in either read or write operation. The read path is still enabled for all columns in the memory block even though only one column is essential, whilst the write path is identical to that of the 6-t cell and suffers equivalent inefficiency and vulnerability to noise.

Cell designs have been published which seek to address this power wastage via the addition of a column select signal to activate only the cell being accessed. One such design is described in U.S. Pat. No. 7,164,596 and from FIG. 4 it will be appreciated it has the addition of two transistors in series with the access devices as well as the extra column select line CS so that only if both WL and CS are high will the cell be accessed. Whilst this addresses the wasted power issue, it does nothing to solve the noise vulnerability of the selected cell during a read and indeed possibly makes the balancing of device strengths to achieve robust read and write more problematic. A cell operating on a similar principle except locally gating the word line is described in U.S. Pat. No. 7,808,812 and suffers from the same shortcomings.

US2010/0124099 provides an SRAM cell comprising a pair of cross-coupled inverters having a storage node, and an NMOS transistor having a gate terminal, a first and second source/drain terminal connected to the storage node, a read word line (RWL) and a read bit line (RBL), respectively in which the RWL and the RBL are activated during a read operation but are not activated during a write operation. The arrangement does not provide a data dependent conductive path between the first and second bit lines.

In view of the above, it will be appreciated that there still exists a requirement for an improved arrangement in which the power consumption can be reduced whilst still maintaining an acceptable level of performance.

Accordingly, the present invention provides a memory unit comprising: a storage element comprising a pair of back to back inverters having respective first and second storage access nodes; first and second voltage lines across which said pair of back to back inverters are connected; a first access transistor connected to said first storage node; a second access transistor connected to said second storage node; a write word line connected to a gate on said first access transistor and a gate on said second access transistor; a first bit line operably connected for controlling said first storage node; a second bit line operably connected for controlling said second storage node; and characterised by a data dependent conductive path between the first and second bit lines that is controlled by the data stored by the storage element.

In a preferred arrangement the data dependent conductive path comprises two MOS transistors (MDR and MAR) forming the data-dependent conduction path between the two bit lines and controlled by one or other of the first and second nodes.

Preferably, the first of said MOS transistors is connected directly to bit line (BLB) and to the first bit line (BLA) via a second of the two MOS transistors and wherein the second MOS transistor includes a gate operably connected to a read word line.

Alternatively, the data dependent conductive path may comprise two NMOS transistors (MDR and MAR) forming the data-dependent conduction path between the two bit lines.

In a still further alternative, the data dependent conductive path may comprise two PMOS transistors forming the data-dependent conduction path between the two bit lines.

Alternatively, the data dependent conductive path may comprise a mixture of NMOS and PMOS transistors forming the data-dependent conduction path between the two bit lines.

Advantageously, said first access transistor is connected to said first bit line (BLA) for writing thereto and said second access transistor is connected to said second bit line (BLB) for writing thereto.

Preferably, said first access transistor is connected to said first voltage line (VSS) and said second access transistor is connected to said first voltage line (VSS) and further including a first switch, to enable and disable the connection to the first voltage line (VSS) under control of a first of said bit lines and a second switch, to enable and disable the connection to the first voltage line (VSS) under control of a second of said bit lines.

Advantageously, said first switch comprises a first switch transistor (MAX1) between the first voltage line (VSS) and the first storage node and a second switch transistor between the first voltage line, (VSS) and wherein each switch comprises a transistor includes a gate and wherein the gate of the first switch transistor is connected to the first bit line (BLA) and the gate the second switch transistor is connected to the second bit line (BLB).

In one arrangement there is provided a BLB controlled switch connected between the BLA line and the first access transistor and a BLA controlled switch connected between the BLB line and the second access transistor.

Advantageously, said BLB controlled switch comprises a transistor having a gate and wherein said gate is connected to the first bit line (BLA) and wherein said BLA controlled switch comprises a transistor having a gate connected to the second bit line (BLB).

In one arrangement there is provided a pair of back-to-back memory cells sharing a common first voltage line and a common second voltage line but having separate read word lines and separate write word lines.

Preferably, the above arrangement includes first and second switches and wherein each of said memory cells include first and second access transistors (MA1, MA3 and MA2, MA4) and each of said first access transistors (MA1, MA3) are connected to the voltage source (VSS) via said first switch (MAX1) and each of said second access transistors (MA2, MA4) are connected to the voltage source (VSS) via said second switch.

Advantageously, said first switch comprises a transistor and includes a gate connected to the first bit line (BLA) and the second switch comprises a transistor including a gate connected to the second bit line (BLB).

Preferably, each of said memory cells include first and second access transistors and (MA1, MA3 and MA2, MA4), wherein said first access transistors, are each connected to the first bit line 28 (BLA) via a first switch (MAX1A) and each of said second assess transistors (MA2, MA4) are connected to the second bit line (BLB) via a second switch.

Advantageously, said first switch comprises a transistor and includes a gate connected to the second bit line (BLB) and wherein the second switch transistor includes a gate connected to the first bit line (BLA).

The present invention will now be more particularly described by way of example only with reference to the accompanying drawings, in which.

Figure 1:
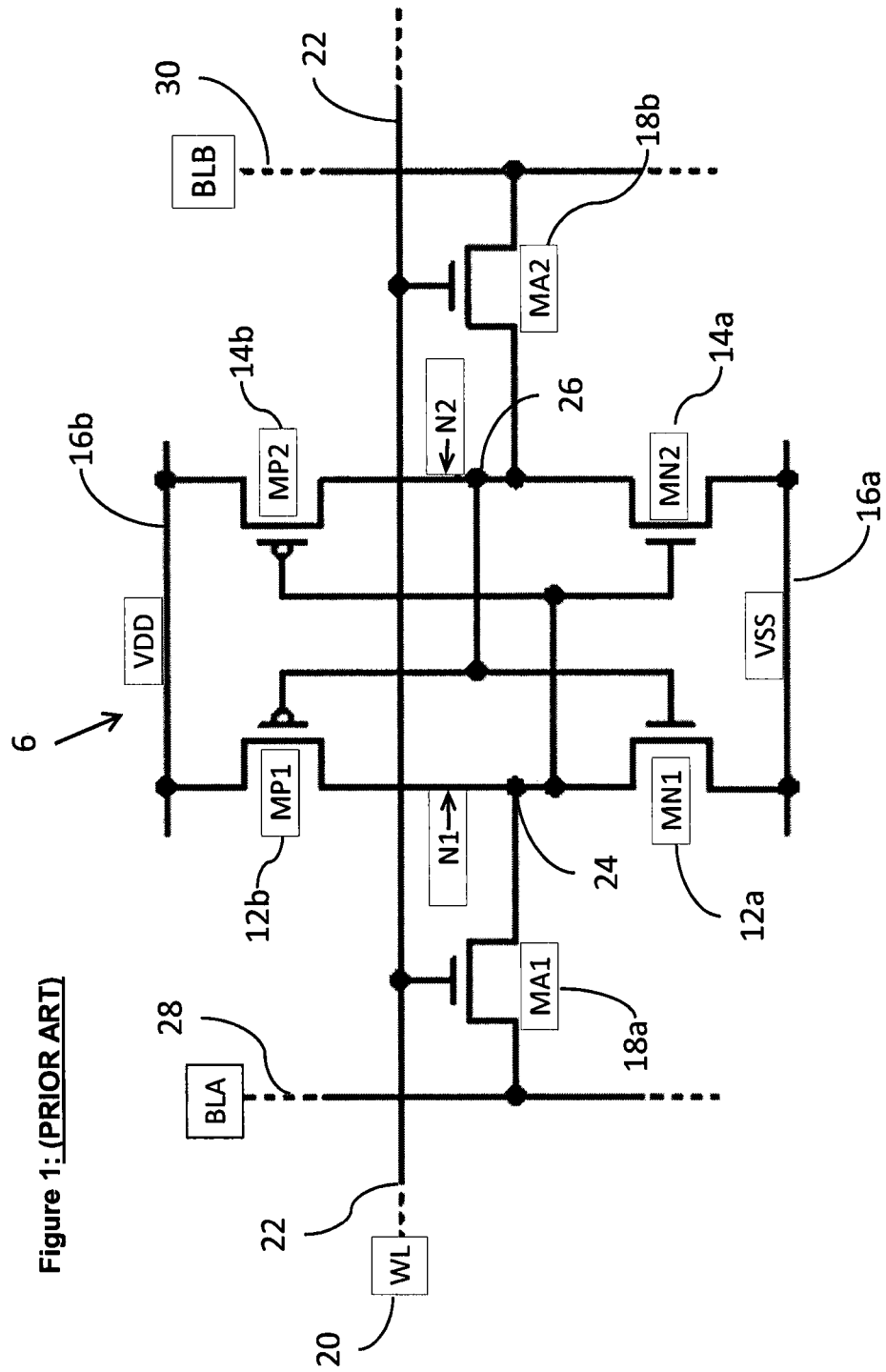
FIG. 1 illustrates a standard 6-transistor memory cell of the prior art.
Figure 2:
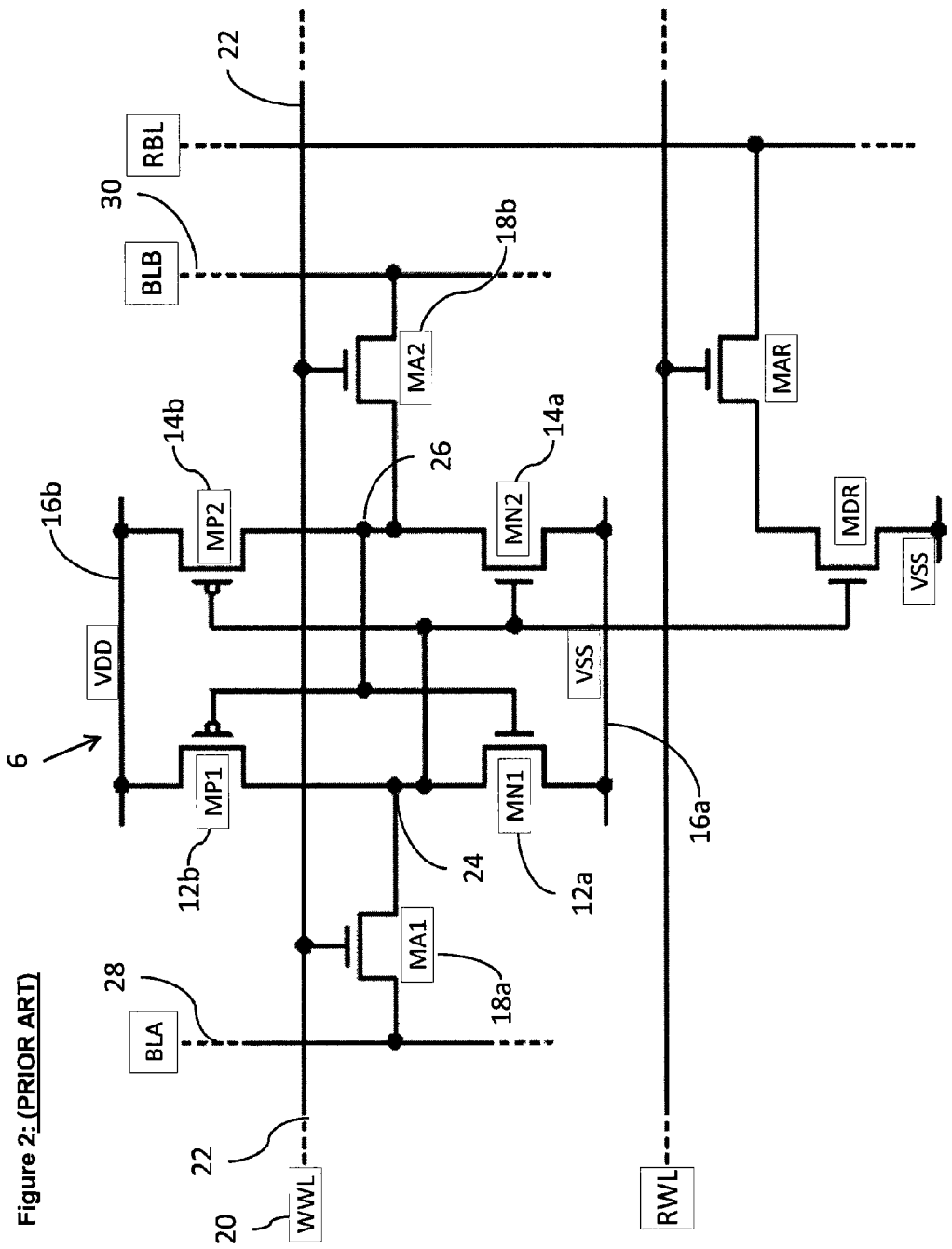
FIG. 2 illustrates an 8-transistor memory cell with buffered operation of the prior art.
Figure 3:
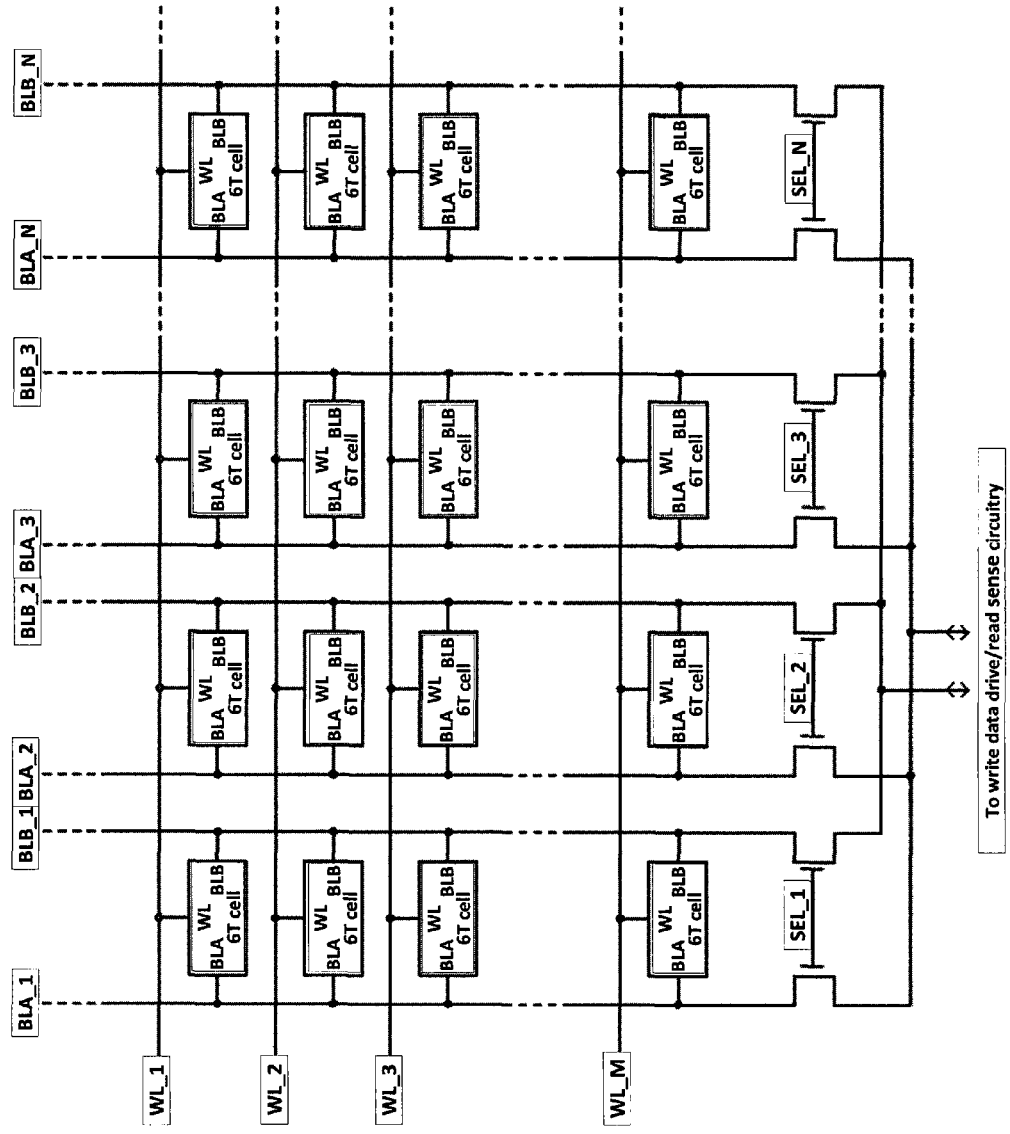
FIG. 3 illustrates a block of 6-T memory cells of the prior art.
Figure 4:
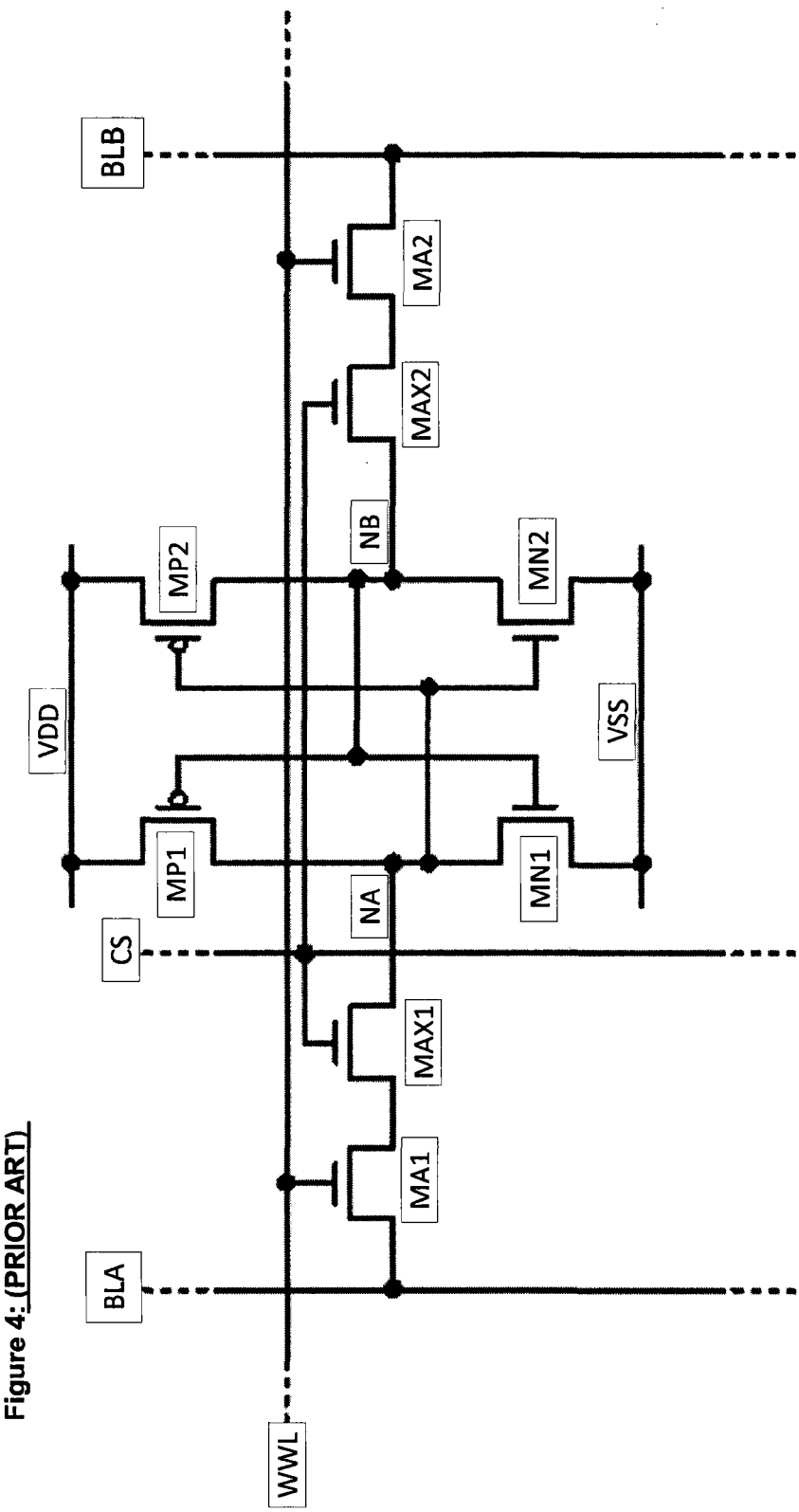
FIG. 4 illustrates a SRAM cell with column select lines of the prior art.
Figure 5:
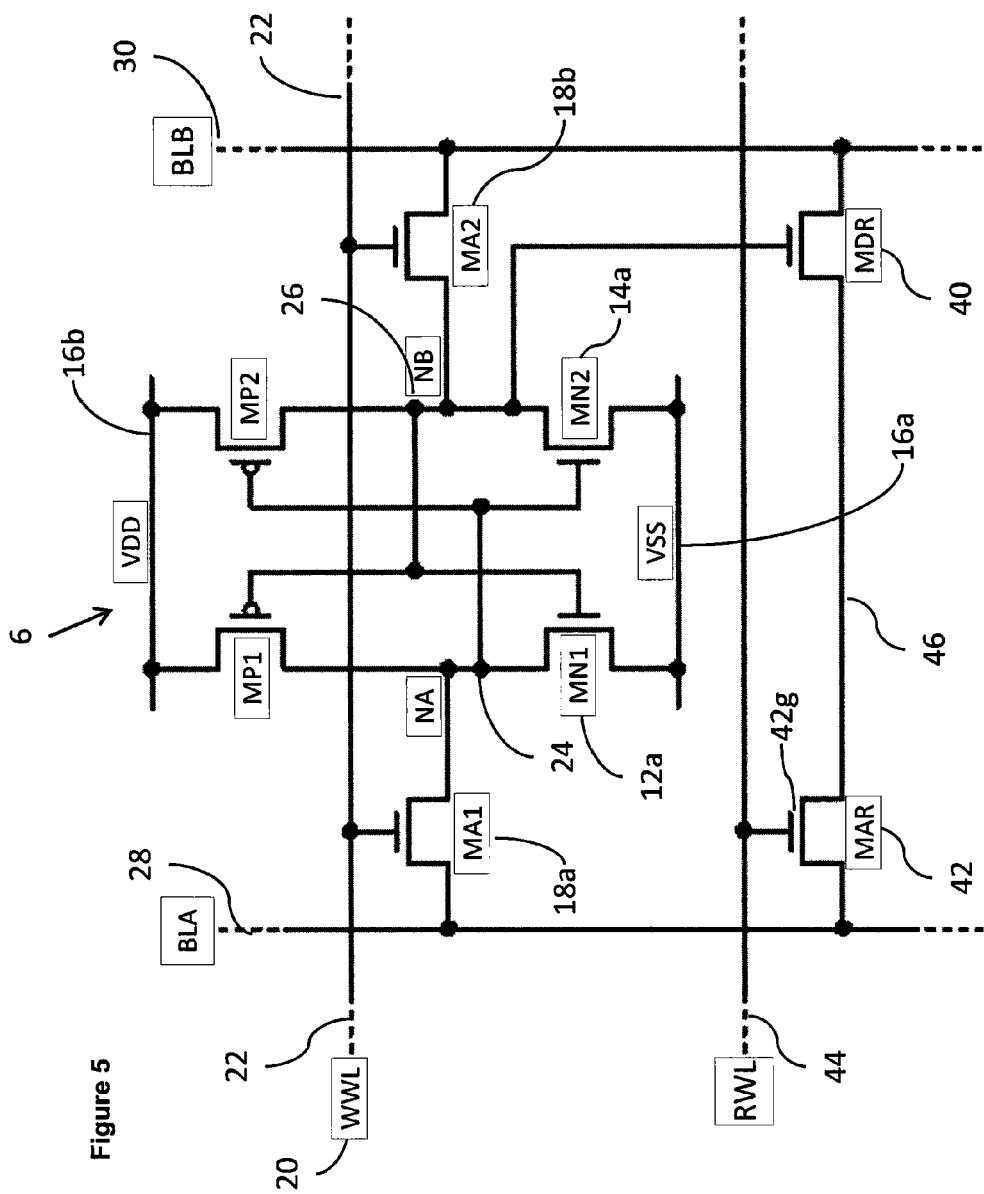
FIG. 5 illustrates a bit line selected read 8-transistor memory cell.
Figure 8:
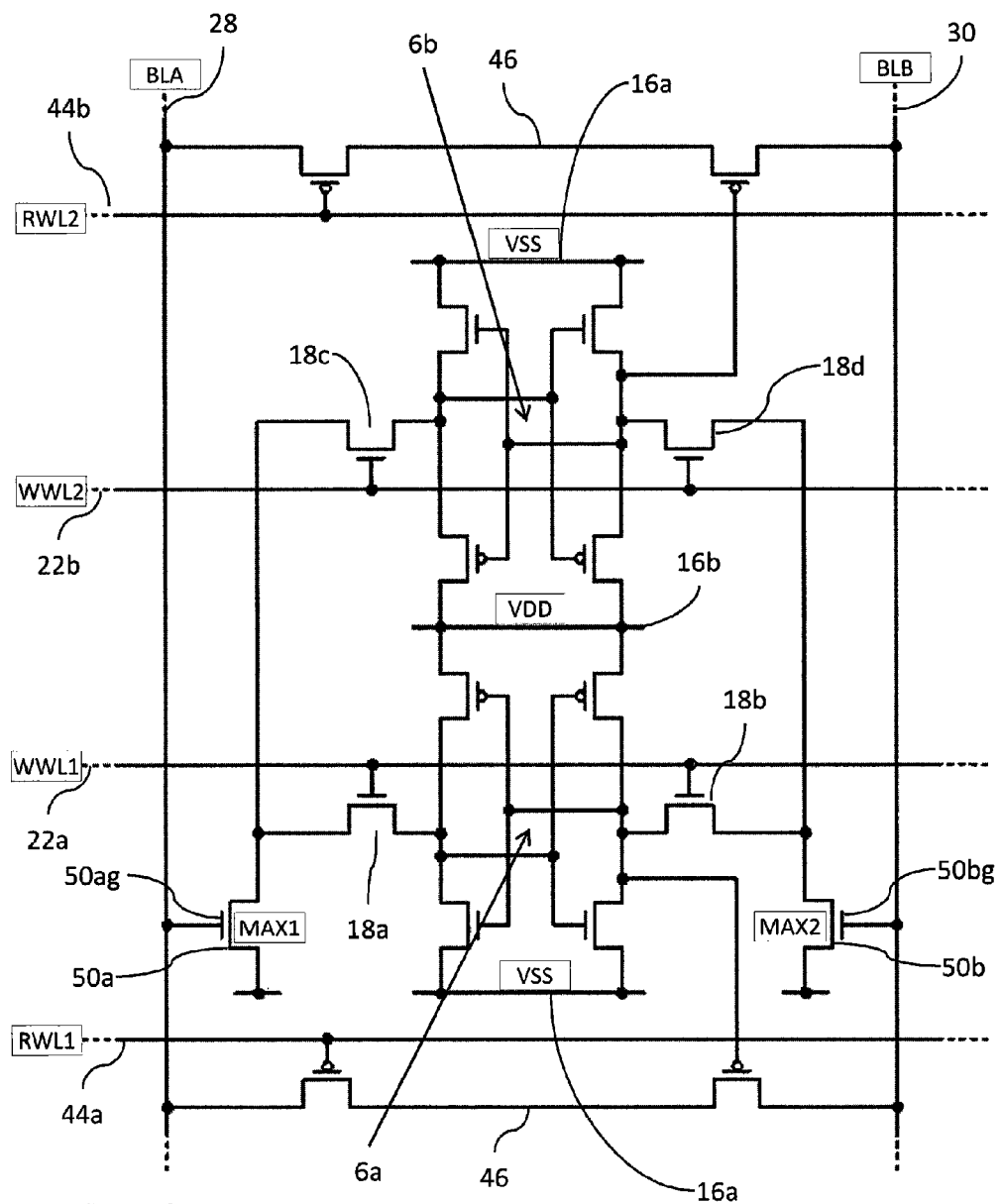
Figure 9:
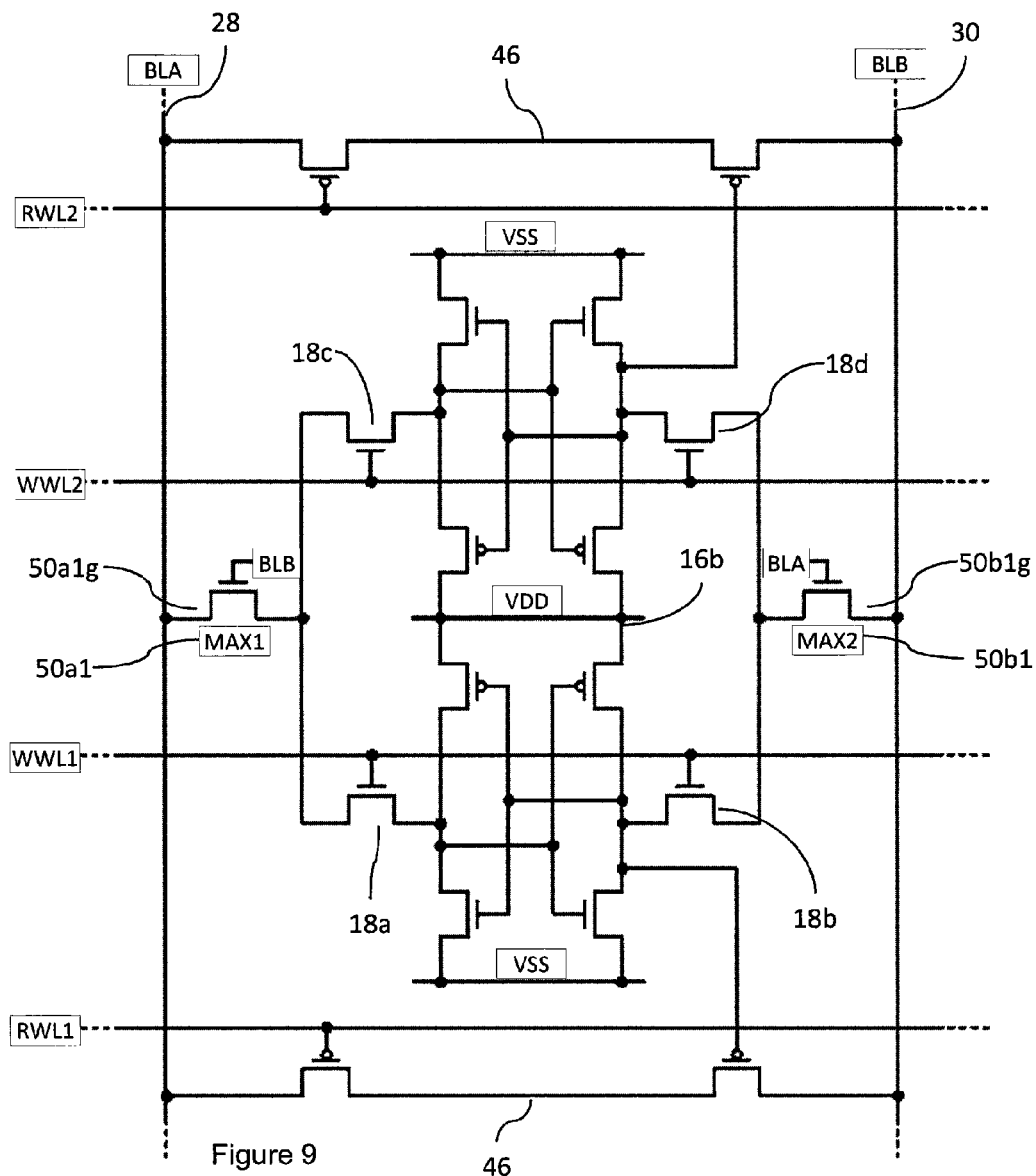

FIG. 8 illustrates a pair of the first version of cells with shared write enabled devices; and FIG. 9 illustrates a pair of the second version of cells with shared write enabled devices Referring now to FIG. 5, there is shown an arrangement which is superficially similar to the standard 8-t cell but has the addition of a read word line RWL. In particular, the arrangement includes memory unit 4 having a storage element 6 made up of two back-to-back inverters 12a, 12b and 14a, 14b connected across voltage lines 16a VSS and 16b VDD and additional access transistors 18a, 18b. The access transistors 18a 18b are turned ON by means of word line control shown schematically at 20 (WWL) connected to write word line 22 and which acts to form a conducting path between the cell data storage nodes 24, 26 (N1 and N2) and external bit lines 28, 30 (BLA and BLB). Writing to the cell is achieved by forcing a high voltage onto one of the two bit lines 28, 30 (BLA or BLB) whilst simultaneously forcing a low voltage onto the other, and then driving the write word line 22 (WWL) high to activate the access path allowing the voltage levels held on the bit lines 28, 30 (BLA and BLB) to overcome the state of the storage element 6. The write word line 22 (WWL) is then driven low to disconnect the memory cell 6 with its data store held in its new state.

One crucial part of the design of this cell is the drive strength ratios of the NMOS pull down transistors 12a, 14a (MN1 and MN2), the NMOS access devices 18a, 18b (MA1 and MA2) and the PMOS pull up devices 12b, 14b (MP1 and MP2) in that the access devices 18a, 18b (MA1, MA2) need to be sufficiently large relative to the pull-ups 12b, 14b (MP1 and MP2) to guarantee the cell state is overwritten during a write, but not so large (relative to the pull-downs) that the cell 6 becomes overloaded and unstable during a read thereby causing the stored data value to be lost.

The reader will appreciate that the design of FIG. 5 does not have a separate read bit line, and more crucially includes a data sense device 40 MDR, which, instead of being connected to voltage source line 16a (VSS), is connected to the second bit line 30 (BLB) and indirectly to the first bit line 28 (BLA). A read word line 44 (RWL) is connected to drive the gate 42g of read access device 42 (MAR) which connects data sensing device 40 (MDR) to bit line 28 (BLA). This configuration means that when a read is performed by driving read word line 44 (RWL) high, the cell 6 itself does not exert any influence on either bit line 28 or 30 (BLA, BLB), but instead forms a data-dependent conduction path 46 between the two bit lines according to the state of the storage element 6. A read operation is performed by then externally applying some voltage change on one of bit lines 28, 30 (BLA, BLB), and detecting the presence or absence of that signal on the other; e.g. pulling bit line 28 (BLA) low and testing to see whether or not bit line 30 (BLB) follows. This effectively uses the bit lines themselves to determine whether a particular cell is being accessed for read rather than using an additional column select signal. This feature is central to the invention as claimed on filing and is common to all embodiments shown in the FIGS. 5 to 9.

The design in FIG. 5 shows two NMOS devices 40, 42 (MDR and MAR) forming the data-dependent conduction path between the two bit lines. Whilst this is the most sensible choice for enhancing a conventional sensing scheme in which the bit lines are normally held high, these devices could alternatively be implemented as PMOS devices, or in principle by any combination of the two (with appropriate modification of the RWL control). All of these possible variants are summarised in Table 1.

TABLE 1

Possible variants of MAR and MDR devices in bit line selected read cell

| MAR | | MDR | | | |
|---|---|---|---|---|---|
| Type | RWL | Type | Gate conn. | Vpu | Vpd |
| NMOS | Active high | NMOS | NA | Vdd-Vtn | 0 |
| NMOS | Active high | NMOS | NB | Vdd-Vtn | 0 |
| NMOS | Active high | PMOS | NA | Vdd-Vtn | Vtp |
| NMOS | Active high | PMOS | NB | Vdd-Vtn | Vtp |
| PMOS | Active low | NMOS | NA | Vdd-Vtn | Vtp |
| PMOS | Active low | NMOS | NB | Vdd-Vtn | Vtp |
| PMOS | Active low | PMOS | NA | Vdd | Vtp |
| PMOS | Active low | PMOS | NB | Vdd | Vtp |

Vpu is the voltage level on BLB when BLA is pulled up to VDD with MAR and MDR both ON.
Vpd is the voltage level on BLB when BLA is pulled down to 0 V with MAR and MDR both ON.

Figure 6:
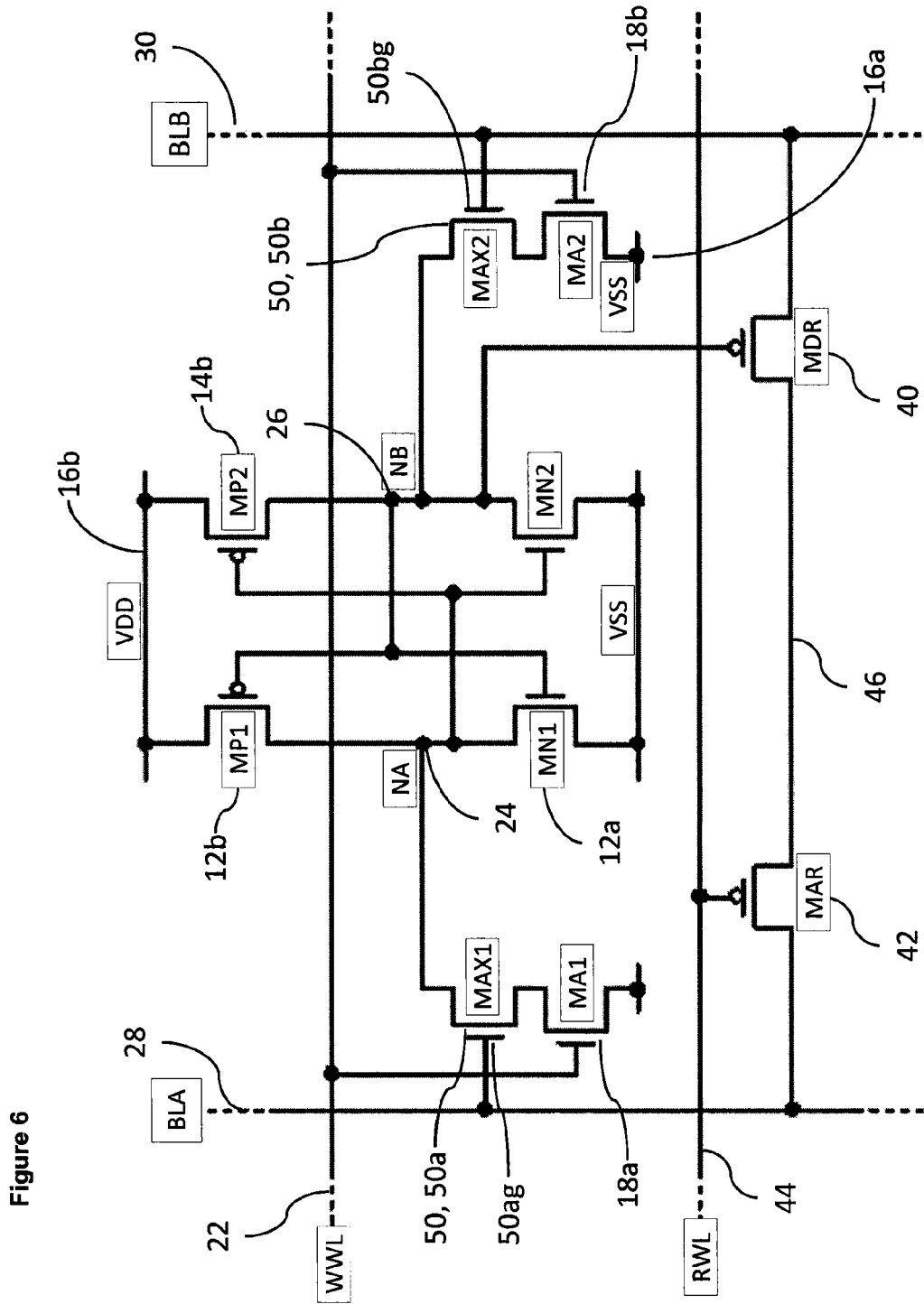
FIG. 6 illustrates a first version of a bit line selected write 10-transistor memory cell.

As outlined above, the creation of a data-dependent conduction path between the bit lines during the read operation effectively accomplishes the column select operation using the state of the bit lines themselves to determine if the column is active. This principle of selecting individual columns for access using the state of the bit lines can further be extended to write operations with the addition of two extra transistors. One such embodiment of this is shown in FIG. 6. In this design, rather than the write word line 22 (WWL) coupling the bit lines 28, 30 (BLA, BLB) into the cell 6 via the access devices 18a, 18b (MA1, MA2), it instead enables a pull down path on one side or other of the storage nodes 24, 26 depending on which of BLA and BLB is high. One significant departure from traditional operation using this cell is that the default state for all inactive bit lines should be low, thereby turning off the paths through MAX1 and MAX2 and disconnecting all cells on unselected columns. In the particular arrangement of FIG. 6, said first access transistor 18a is connected to said first voltage line 16a (VSS) and said second access transistor 18b is connected to said first voltage line 16a (VSS) and further including a first switch 50a, to enable and disable the connection to the first voltage line 16a (VSS) under control of a first of said bit lines and a second switch 50b, to enable and disable the connection to the first voltage line 16a (VSS) under control of a second of said bit lines. The switches 50a, 50b may comprise transistors 50a, 50b includes a gate 50ag, 50bg and the gate 50ag of the first switch transistor 50a is connected to the first bit line 28 (BLA) whilst the gate 50bg of the second switch transistor 50b is connected to the second bit line 30 (BLB). A data dependent conductive path 46 comprises two MOS devices 40, 42 (MDR and MAR) forming the data-dependent conduction path between the two bit lines 28, 30 and these are controlled by one or other of the first and second nodes 24, 26 as and when required. In this particular arrangement the MOS device 40 is connected directly to second bit line 30 (BLB) and to the first bit line 28 (BLA) via a second 42 of the two MOS devices and the second MOS device 42 includes a gate 42g operably connected to a read word line 44 such as to control the connection between the bit lines 28, 30 (BLA, BLB).

The bit line selected read devices in FIG. 6 are shown as being PMOS as these are the most natural choice for a default low bit line sense scheme since PMOS devices will pull BLB all the way to the top rail during a read if the selected cell's data path is ON. However this choice is not mandatory, and a sensing scheme using NMOS devices can easily be conceived with a two-stage sensing process in which during the first stage of the read operation BLA is first pulled high with BLB left floating, and then BLB clamped low with the drive on BLA released and the state of BLA tested to see if it is discharged through the selected cell.

Figure 7:
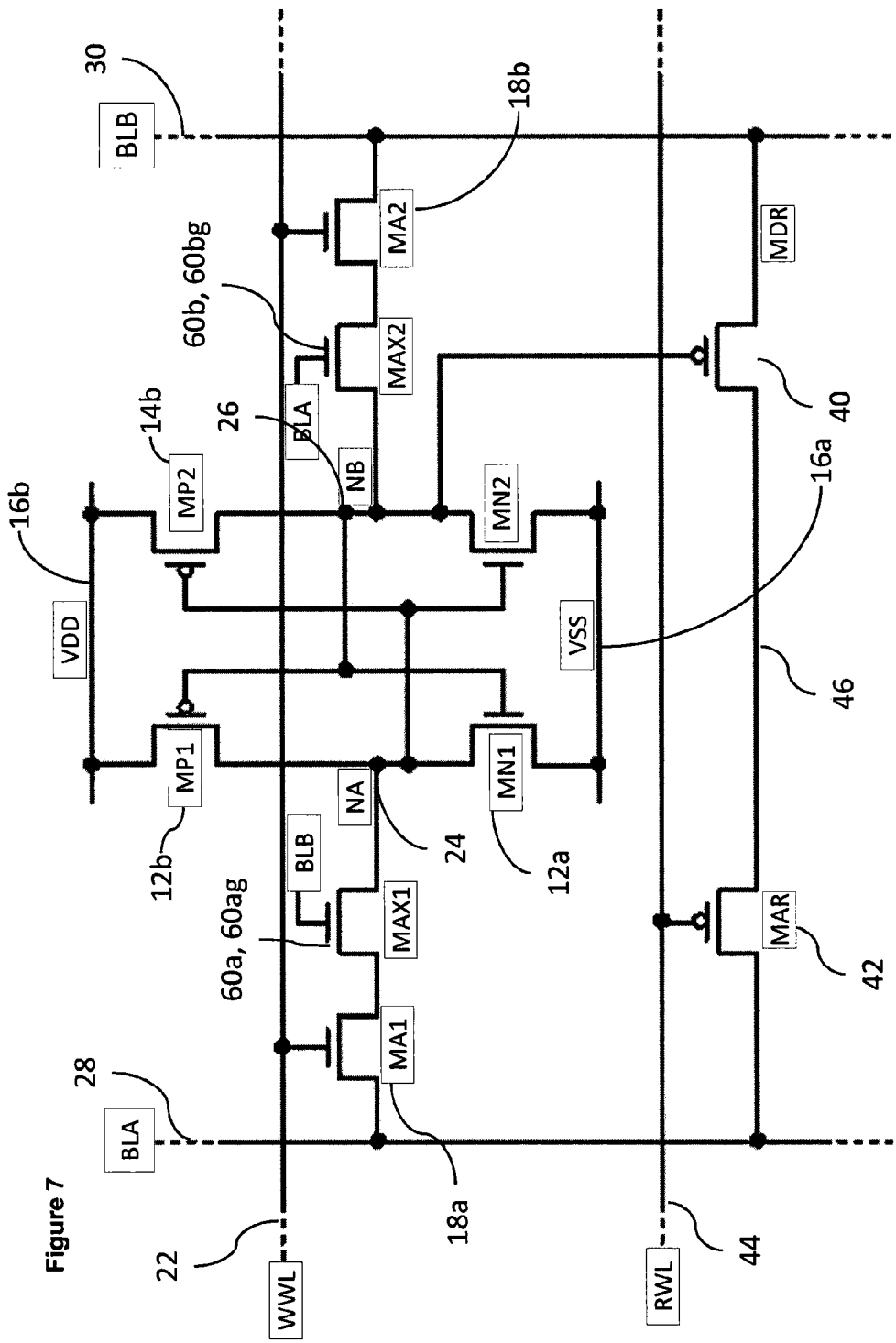
FIG. 7 illustrates a second version of a bit line selected write 10-transistor memory cell.

One alternative embodiment of this principle is shown in FIG. 7. The operation and performance is identical to the previous implementation except that the write path is pulled down to the low bit line (rather than the VSS rail) by dint of the high bit line. While offering no performance advantage over the previous version, this option may prove more efficient for layout. The particular arrangement of FIG. 7 includes a BLB controlled switch 60a connected between the access transistor 18a on the BLA line and the first node 24 and a BLA controlled switch 60b connected between the access transistor 28b on the BLB line and the second access transistor node 26. Preferably, said BLB controlled switch 60a comprises a transistor having a gate 60ag and said gate 60ag is connected to the first bit line 28 (BLA) and said BLA controlled switch 60b comprises a transistor having a gate 60bg connected to the second bit line 30 (BLB).

In both the above versions the write and read paths are essentially separate so in principle the bit line selected write technique could be used in conjunction with the buffered read path from the traditional 8-t cell (though sacrificing the read power savings). Also, in both versions the gate connections to 18a (MA1) and (50a, 60a) MAX1 devices (and similarly 18b (MA2) and 50b, 60b (MAX2)) are interchangeable, and swapping those may allow sharing of transistors between a number of cells 6 on the same column, depending on layout constraints. Examples of this for each cell version are shown in FIGS. 8 and 9.

The arrangement of FIG. 8 provides a pair of back-to-back memory cells 6a, 6b which may share a common first voltage line 16a and a common second voltage line 16b but having separate read word lines 44a, 44b and separate write word lines 22a, 22b. First and second access transistors 18a, 18c, and 18b, 18d (MA1, MA3 and MA2, MA4) are provided such that each of said first access transistors 18a, 18c (MA1, MA3) are connected to the first voltage source 16a (VSS) via a first switch in the form of, for example, first switch transistor 50a (MAX1) and each of said second access transistors 18b, 18d (MA2, MA4) are connected to the voltage source 16a (VSS) via a second switch in the form of, for example, second switch transistor (50b). Preferably, said first switch transistor 50a includes a gate 50ag connected to the first bit line 28 (BLA) and the second switch transistor 50b includes a gate 50bg connected to the second bit line 30 (BLB).

The arrangement of FIG. 8 depicts a pair of cells 6a, 6b on the same column in a memory array but on separate adjacent rows. The operation of the cell pair is identical to the operation of each individual cell, but the commonality of the 16a VSS voltage rail throughout the array, and the bit lines 28, 30 (BLA, BLB) throughout a column, allows the data-dependent access transistors 50a, 50b (MAX1, MAX2) used for the write operation to be shared between the two memory cells 6a, 6b thereby reducing the overall number of transistors required for the cell pair and potentially saving area. Normally the voltage on both bit lines 28, 30 will be driven low thereby turning both MAX1 and MAX2 off, and isolating all the cells in the column from the write pull-down path to VSS. To write data into one of the cells 6a, 6b, one of the bit lines 28, 30 (BLA, BLB) is driven high to turn on the required data-dependent access transistor (one of MAX1 and MAX2). Driving one of the write word lines 22a, 22b (WWL1, WWL2) high according to which of the two cells is to be selected for the write operation then turns on the pull-down path for that cell through one of MAX1 and MAX2, thereby forcing its storage nodes into the required state.

The arrangement of FIG. 9 differs from that of FIG. 8 in that each of the first access transistors 18a, 18c are now connected to the first bit line 28 (BLA) via a BLB controlled switch 50a1 and the second access transistors 18b, 18d are connected to the second bit line 30 (BLB) via a BLA controlled switch 50b1. Preferably, said first switch comprises a transistor 50a1 including a gate 50a1g connected to the second bit line 30 (BLB) and the second switch comprises a transistor 50b1 includes a gate 50b1g connected to the first bit line 28 (BLA).

The arrangement of FIG. 9 depicts a pair of cells 6a, 6b on the same column in a memory array but on separate adjacent rows. The operation of the cell pair is identical to the operation of each individual cell, but the commonality of the bit lines 28, 30 (BLA, BLB) throughout a column allows the data-dependent access transistors 50a1, 50b1 (MAX1, MAX2) used for the write operation to be shared between the two memory cells 6a, 6b thereby reducing the overall number of transistors required for the cell pair and potentially saving area. Normally the voltage on both bit lines 28, 30 will be driven low thereby turning both MAX1 and MAX2 off, and isolating all the cells in the column from the bit lines 28, 30. To write data into one of the cells 6a, 6b, one of the bit lines 28, 30 (BLA, BLB) is driven high to turn on the required data-dependent access transistor (one of MAX1 and MAX2) whilst keeping the other bit line driven low. Driving one of the write word lines 22a, 22b (WWL1, WWL2) high according to which of the two cells is to be selected for the write operation then turns on the write path for that cell through one of MAX1 and MAX2 to the low bit line, thereby forcing its storage nodes into the required state.

It will be appreciated that individual items described above may be used on their own or in combination with other items shown in the drawings or described in the description and that items mentioned in the same sentence as each other or the same drawing as each other need not be used in combination with each other. In addition the expression "means" may be replaced by actuator or system or device as may be desirable. In addition, any reference to "comprising" or "consisting" is not intended to be limiting any way whatsoever and the reader should interpret the description and claims accordingly.

Those skilled in the art will appreciate that the above-described invention can be applied to SRAM, non-volatile flash memory and DRAM.

The invention claimed is:

1. A memory unit comprising:
   a) a storage element comprising a pair of back to back inverters having respective first and second storage access nodes;
   b) first and second voltage lines across which said pair of back to back inverters are connected;
   c) a first access transistor, connected to said first storage access node;
   d) a second access transistor, connected to said second storage access node;
   e) a write word line connected to a gate on said first access transistor and a second gate on said second access transistor;

f) a first bit line operably connected for controlling said first storage access node;

g) a second bit line operably connected for controlling said second storage access node; and characterised by a data dependent conductive path between the first and second bit lines that is controlled by data stored by the storage element, wherein the data dependent conductive path comprises first and second MOS transistors connected via source or drain terminals forming a data-dependent conduction path between the first and second bit lines and controlled by one of the first and second storage access nodes.

2. The memory unit as claimed in claim 1, wherein the first MOS transistor is connected directly to the second bit line and to the first bit line via the second MOS transistor and wherein the second MOS transistor includes a gate operably connected to a read word line.

3. The memory unit as claimed in claim 1, wherein the data dependent conductive path comprises two NMOS transistors forming the data-dependent conduction path between the first and second bit lines.

4. The memory unit as claimed in claim 1, wherein the data dependent conductive path comprises two PMOS transistors forming the data-dependent conduction path between the first and second bit lines.

5. The memory unit as claimed in claim 1, wherein the data dependent conductive path comprises a mixture of NMOS and PMOS transistors forming the data-dependent conduction path between the first and second bit lines.

6. The memory unit as claimed in claim 1, wherein said first access transistor is connected to said first bit line for writing thereto and said second access transistor is connected to said second bit line for writing thereto.

7. The memory unit as claimed in claim 1, wherein said first access transistor is connected to said first voltage line and said second access transistor is connected to said first voltage line and further including a first switch, to enable and disable the connection to the first voltage line under control of the first bit line and a second switch, to enable and disable the connection to the first voltage line under control of the second bit line.

8. The memory unit as claimed in claim 7, wherein said first switch comprises a first switch transistor between the first voltage line and the first storage access node and wherein said second switch comprises a second switch transistor between the first voltage line and the second storage access node, wherein each switch transistor comprises a gate and wherein the gate of the first switch transistor is connected to the first bit line and the gate of the second switch transistor is connected to the second bit line.

9. The memory unit as claimed in claim 1, further comprising a second bit line controlled switch connected between the first bit line and the first access transistor and a first bit line controlled switch connected between the second bit line and the second access transistor.

10. The memory unit as claimed in claim 9, wherein said second bit line controlled switch comprises a transistor having a gate and wherein said gate is connected to the first bit line and wherein said first bit line controlled switch comprises a transistor having a gate connected to the second bit line.

11. The memory unit as claimed in claim 7, further comprising a pair of back-to-back memory cells sharing a common first voltage line and a common second voltage line but having separate read word lines and separate write word lines.

12. The memory unit as claimed in claim 10, further comprising first and second switches and a pair of back-to-back memory cells, wherein the memory cells include the first and second access transistors and each of said first access transistors are connected to the first voltage line via said first switch and each of said second access transistors is connected to the first voltage line via said second switch.

13. The memory unit as claimed in claim 11, wherein said first switch comprises a first switch transistor including a gate connected to the first bit line and the second switch comprises a second switch transistor including a gate connected to the second bit line.

14. The memory unit as claimed in claim 10, further comprising a pair of back-to-back memory cells, wherein each of said memory cells comprises first and second access transistors, wherein said first access transistors are each connected to the first bit line via a first switch and each of said second assess transistors are connected to the second bit line via a second switch.

15. The memory unit as claimed in claim 13, wherein said first switch transistor and gate of said first switch are connected to the second bit line and wherein said second switch transistor and gate of the second switch are connected to the first bit line.

* * * * *